US006577126B2

(12) United States Patent
Lehr

(10) Patent No.: US 6,577,126 B2
(45) Date of Patent: Jun. 10, 2003

(54) METHOD OF PRODUCING MAGNETIC RESONANCE IMAGES

(75) Inventor: Heinrich Lehr, Ettlingen (DE)

(73) Assignee: Bruker BioSpin MRI GmbH (DE)

( * ) Notice: Subject to any disclaimer, the term of this patent is extended or adjusted under 35 U.S.C. 154(b) by 53 days.

(21) Appl. No.: 09/812,300

(22) Filed: Mar. 20, 2001

(65) Prior Publication Data

US 2001/0026155 A1 Oct. 4, 2001

(30) Foreign Application Priority Data

Mar. 25, 2000 (DE) .......................................... 100 15 068

(51) Int. Cl.$^7$ ................................................ G01V 3/00
(52) U.S. Cl. ...................................... 324/307; 324/309
(58) Field of Search ................................ 324/307, 309, 324/306; 600/410

(56) References Cited

U.S. PATENT DOCUMENTS

| | | | | | |
|---|---|---|---|---|---|
| 4,780,675 A | * | 10/1988 | DeMeester et al. | ......... | 324/312 |
| 4,833,407 A | * | 5/1989 | Holland et al. | ............. | 324/309 |
| 4,851,779 A | * | 7/1989 | DeMeester et al. | ......... | 324/312 |
| 4,998,064 A | * | 3/1991 | Fuderer et al. | ............. | 324/309 |
| 5,275,164 A | * | 1/1994 | Maeda et al. | ................ | 600/410 |
| 6,393,313 B1 | * | 5/2002 | Foo | ........................... | 600/410 |

FOREIGN PATENT DOCUMENTS

| | | | |
|---|---|---|---|
| EP | 0372814 A2 | * | 6/1990 |
| EP | 0 372 814 A2 | | 6/1990 |
| EP | 0 564 973 A2 | | 10/1993 |
| EP | 0564973 A2 | * | 10/1993 |

OTHER PUBLICATIONS

E. M. Haacke et al., article "A Fast, Iterative, Partial–Fourier Technique Capable of Local Phase Recovery". Journal of Magnetic Resonance vol. 92, pp. 126–145 1991.*
E. M. Haacke, article "The Effects of Finite Sampling in Spin–Echo or Field–Echo Magnetic Resonance Imaging". Magnetic Resonance in Medicine vol. 4, pp. 407–421 1987.*
Margosian, Paul: "Faster MR Imaging–Imaging with Half the Data" in: Magnetic Resonance in Medicine, 1985, pp. 1024–1025.
Barone, P. et al: "A New Method of Magnetic Resonance Image Reconstruction with Short Acquisition Time and Truncation Artifact Reduction" in: IEEE Transactions on Medical Imaging, vol. 11, No. 2, Jun. 1992, pp. 250–259.

* cited by examiner

Primary Examiner—Edward Lefkowitz
Assistant Examiner—Tiffany A. Fetzner
(74) Attorney, Agent, or Firm—Walter A. Hackler

(57) ABSTRACT

A method of producing magnetic resonance images wherein a (n+1) dimensional k space is scanned by means of an imaging pulse sequence with at least one RF excitation pulse followed by at least one RF refocusing pulse, wherein an incomplete complex spin echo signal $S_x$ is read and digitized by means of a quadrature detector, in one part of the read-out interval $[t_0-½t_a, t_0+½t_a]$ which has a central position about the center ($t=t_0$) of the spin echo signal in the time interval $[t_0-\epsilon; t_0+\epsilon]$, with n (n=0,1,2, ... ) phase encoding gradients before the read-out interval, is characterized in that the digitized, incomplete, complex spin-echo signal is completed for the entire read-out interval by adding zeros and the central symmetrical part is weighted with a function which is substantially anti-symmetrical about the point $t=t_0$ and has an amplitude of ½ at $t_0$, and is subsequently Fourier-transformed for producing a Fourier-transformed signal. This permits start of image reconstruction while subsequent image data is still being read.

20 Claims, 8 Drawing Sheets

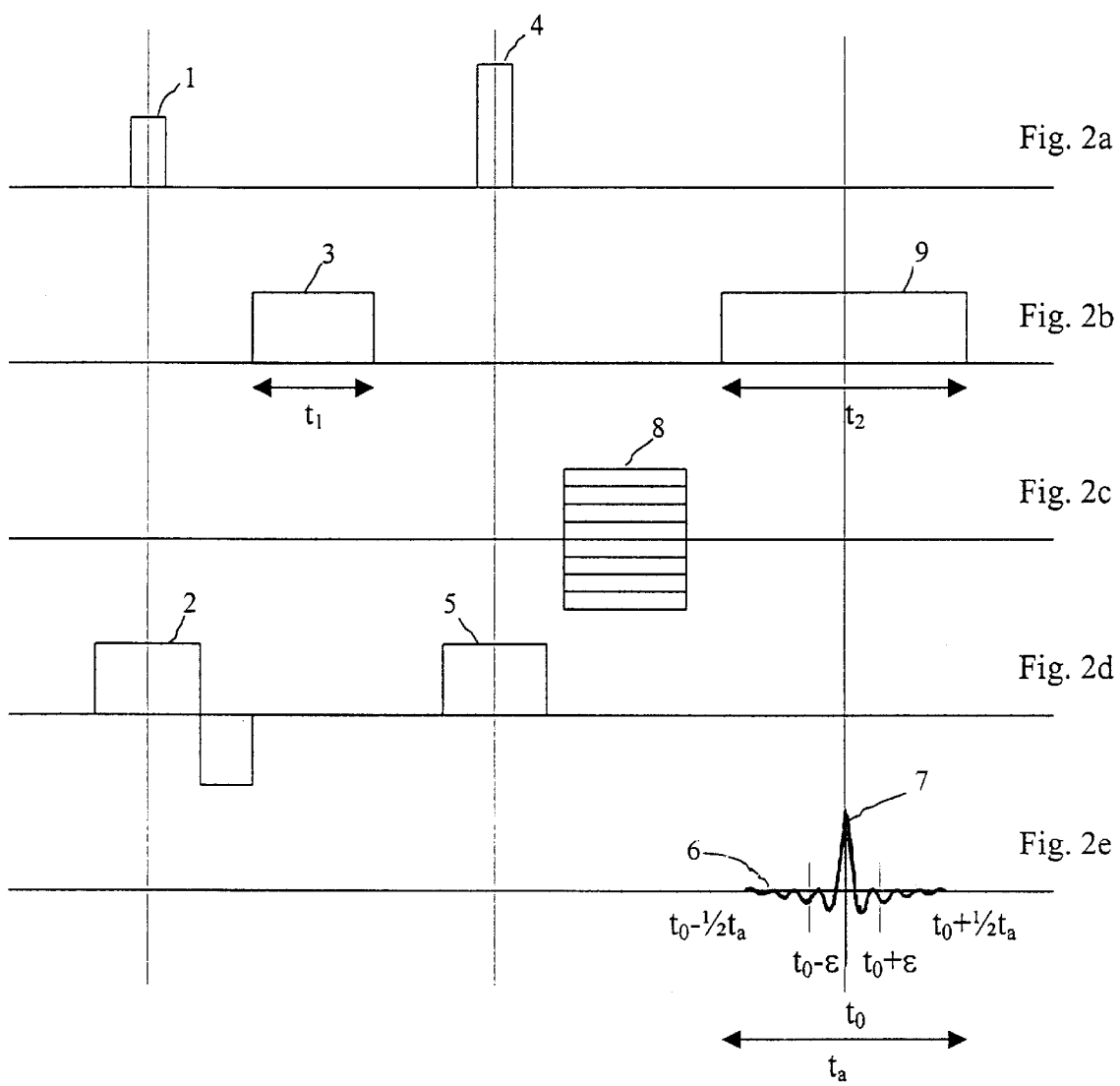

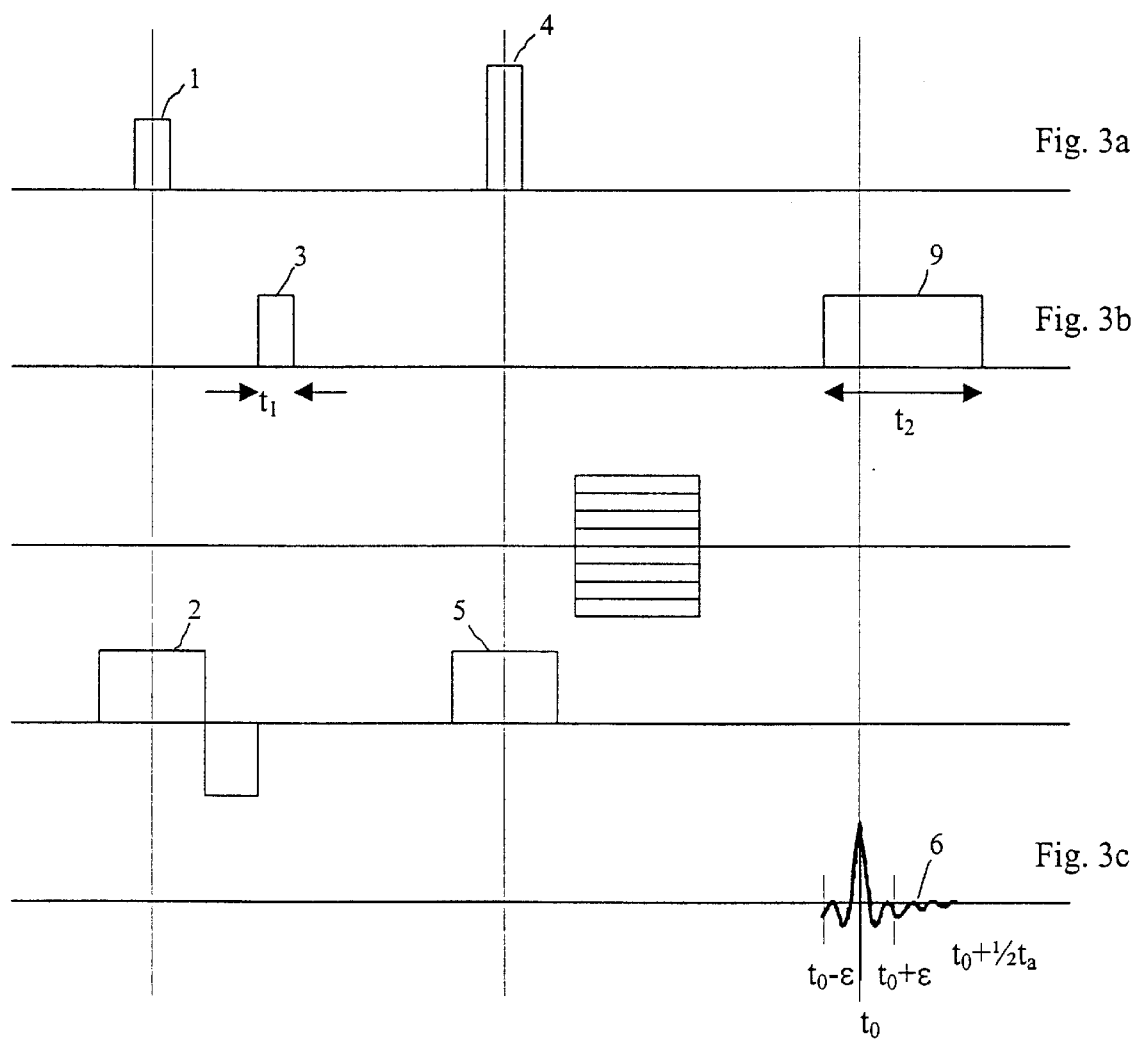

METHOD OF PRODUCING MAGNETIC RESONANCE IMAGES

This application claims Paris convention priority of German Patent Application 10015068.3 filed on Mar. 25, 2000, the complete disclosure of which is hereby incorporated by reference.

BACKGROUND OF THE INVENTION

The invention concerns a method of producing magnetic resonance images, wherein a (n+1) dimensional k space is scanned, comprising an imaging pulse sequence with at least one RF excitation pulse followed by at least one RF refocusing pulse, wherein an incomplete, complex spin echo signal $S_x$ is measured and digitized in one part of the read-out interval $[t_0-\frac{1}{2}t_a, t_0+\frac{1}{2}t_a]$ by means of a quadrature detector, which comprises a central part about the center ($t=t_0$) of the spin echo signal in the time interval $[t_0-\epsilon, t_0+\epsilon]$ with $n(n=0, 1, 2, \ldots)$ phase encoding gradients before the read-out interval.

A method of this type is disclosed e.g. in U.S. Pat. No. 4,851,779 or U.S. Pat. No. 4,780,675.

In conventional methods of magnetic resonance for producing sectional images, the duration of scanning of the region of interest is that long that movements of the body region observed produce changes which impair the image quality. Due to the number of measuring sequences required for an examination, the total examination time could be between ½ and 1 hour. Long examination times are not desired, in particular not for patients.

To reduce the scanning time, it was tried to scan only incomplete k spaces. The incomplete k spaces are completed by complexly conjugated reflection of the detected data. To carry out this reflection, the entire (incomplete) data set must have been recorded before processing start. Reconstruction requires additional intermediate results in the form of phase images or images of a partial echo.

U.S. Pat. No. 4,851,779 discloses collecting an incomplete data set of three-dimensional magnetic resonance data and storing it in a memory. The incomplete data set is complete in a first and second direction, however, incomplete in a third direction. The detected data set includes data along the third direction between ±n central values and the half of the other values. One-dimensional inverse Fourier transformations are applied in the first and second direction to obtain an intermediate data set. A phase correction matrix or a plurality of phase correction vectors p(r) is produced from the intermediate data set and stored in a phase correction memory.

A symmetrical data set is produced as conjugated complex from the intermediate data set. The intermediate data set and symmetrical data set are inversely Fourier-transformed in the third direction (fa, fs), then the vectors of both image matrices are corrected with the corresponding phase vectors and combined into a line of a resulting three-dimensional image.

Disadvantageously, all data must be recorded in such a method before carrying out Fourier-transformation and intermediate results and phase matrices must be stored.

U.S. Pat. No. 4,780,675 discloses collecting an incomplete set of magnetic resonance image data and storing it in a memory. The incomplete data set comprises a central or first data set and an additional or second data set. A roll-off filter and Fourier transformation is applied to the central data set to obtain a normalized phase image. The first and second data set are Fourier transformed and phase corrected by multiplying with the conjugated complexes of the corresponding phase value. A third data set is produced by determining the conjugated complexes of the second or additional data set. The third data set is Fourier transformed and multiplied with a corresponding value of the phase image to produce a second phase-corrected image representation. The first and second corrected image representations are added and stored in an image memory.

Also in this method, all data must be recorded and stored before further processing. Additionally, the central data set is filtered before producing the phase diagram.

It is therefore the underlying purpose of the present invention to provide a method for faster imaging with substantially constant image quality without increased technical effort.

SUMMARY OF THE INVENTION

In accordance with the invention, this object is achieved in a simple but effective fashion in that the digitized, incomplete, complex spin echo signal $S_x$ is completed through adding zeros for the entire read-out interval and the central part is weighted with a function which is substantially anti-symmetrical about the point $t=t_0$ and has an amplitude of ½ at $t_0$ and subsequently is Fourier transformed for generating a Fourier-transformed signal.

In this method, only slightly more than half of the data of one dimension of a k space is detected. The remaining data is replaced by zeros. At least half of the k space must be detected in the reading direction to determine the position of the center of the spin echo signal and to prevent a loss in resolution.

The inventive method has the advantage that the image is continuously reconstructed and possibly corrected directly after recording each k space line. In particular for resonance images with more than one dimension, this proves to be advantageous since the directly following reconstruction saves considerable time.

After Fourier transformation, the phase can be corrected which produces real images with the same quality. The required phase corrections are known already before data recording. They are determined in a pre-scan. The data is reconstructed parallel to data recording.

By calculating the magnitude of the complex values and the omission of phase correction, image quality is considerably improved.

The article "Faster MR Imaging—Imaging with Half the Data" Society of Magnetic Resonance in Medicine, 1985, pages 1024–1025 describes using half of the phase encoding steps for image reconstruction, whereas the other half is empty and use the real part of the complex image formation for image representation. To prevent ringing artifacts, a roll-off filter must be applied which requires adding some additional phase encoding steps.

To improve the prior art approach, an alternative method variant which utilizes the same inventive basic idea, concerns a method of producing magnetic resonance images wherein a (n+1) dimensional k space is scanned, comprising an imaging pulse sequence with at least one RF excitation pulse in a first step, followed by at least one refocusing pulse, wherein in at least one part of a read-out interval $[t_0-\frac{1}{2} t_a, t_0+\frac{1}{2} t_a)$ at least one part of a complex spin echo signal $S_x$ is measured and digitized, by means of a quadrature detector, which comprises a central part about the center $t=t_0$ of the spin echo signal in the time interval $[t_0-\epsilon, t_0+\epsilon]$ having at least one phase encoding gradient before the read-out interval and wherein in subsequent steps, the phase encoding gradient is systematically incremented and the k space is incompletely scanned in the direction ($k_y$) of the phase encoding gradient such that for each relative point in time in the read-out interval in the phase direction ($k_y$) an incomplete signal $S_y$ is obtained having a portion central about $k_y=0$ wherein for each relative point in time in the read-out interval, the digitized incomplete complex signal $S_y$ is completed through adding zeros along $k_y$ and the central part having a function which is substantially anti-symmetrical about the point $k_y=0$ having an amplitude of ½ at $k_y=0$ is weighted and subsequently Fourier-transformed for producing a Fourier-transformed signal.

Also in this case, only slightly more than half of the data must be read in the direction $k_y$ and data processing and simultaneous reading of the remaining data is possible. This permits on the one hand more rapid imaging and saves on the other hand memory capacity.

In an advantageous further development of the two above-described variants of the inventive method, the Fourier-transformed signal is phase-corrected to clearly separate the real and imaginary parts of the result.

A further preferred embodiment of the inventive method is characterized in that for determining the coefficients of the zero and first order of the phase correction of the Fourier transformed of the spin echo signal, the spin echo signal is recorded without previous influence of a phase encoding gradient and its center is determined by means of an algorithm which takes into consideration the central symmetry thereby utilizing the central symmetry of the spin echo signal. This allows more rapid determination of the center by interpolation methods known per se.

In a further advantageous method variant, the weighting function is a linearly rising or descending function of time which is easy to realize technically. Preferably, the weighting function thereby drops monotonically from one to zero in the interval $[t_0-\epsilon, t_0+\epsilon]$. This compensates over-weighting of the central points during Fourier transformation.

In a particularly preferred further development of the inventive method, the weighting function is a constant with the value ½. This method variant is particularly easy to carry out. It is principally feasible to use any function having an amplitude of ½ at point $t_0$ and is anti-symmetrical to this point.

It is particularly advantageous to start Fourier transformation before scanning of the k space is finished which saves a lot of time, mainly if multiple dimensions are scanned.

A further preferred method variant is characterized in that a dephasing portion of a read gradient is switched before or directly after the RF refocusing pulse and a rephasing portion of the read gradient is switched at least during the interval $[t_0-t_a/2, t_0+\epsilon]$ or $[t_0-\epsilon, t_0+t_a/2]$ wherein under the effect of the rephasing portion of the read gradient, part of the complex spin echo signal $S_x$ is measured. The use of a read gradient eliminates, in principle, one dimension of the k space, namely that of the chemical shift. Thus, the data of one dimension can be recorded in one single read-out process which allows particularly fast detection of data.

Further advantages of the invention can be extracted from the description and the drawing. The features mentioned above and below may be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWINGS

FIG. 1c shows a function which assumes the value ½ at the time to;

FIG. 2a shows a sequence of RF pulses;

FIG. 2b shows a sequence of read gradients;

FIG. 2c shows a phase encoding gradient;

FIG. 2d shows a sequence of slice selection gradients;

FIG. 2e shows a complete spin echo signal;

FIG. 3a shows a sequence of RF excitation pulses;

FIG. 3b shows a sequence of read gradients;

FIG. 3c shows an incomplete spin echo signal;

FIG. 5b shows the incomplete data set in the two-dimensional k space which forms the basis of FIG. 5a;

FIG. 6b shows the incomplete data set in the two-dimensional k space which forms the basis of FIG. 7a;

FIG. 7b shows the incomplete data set in the two-dimensional k space which forms the basis of FIG. 7a;

FIG. 8b shows the data set, which is incomplete in two dimensions, in the two-dimensional k space which forms the basis of FIG. 8a.

DETAILED DESCRIPTION OF THE PREFERRED EMBODIMENTS

Figure 1A:
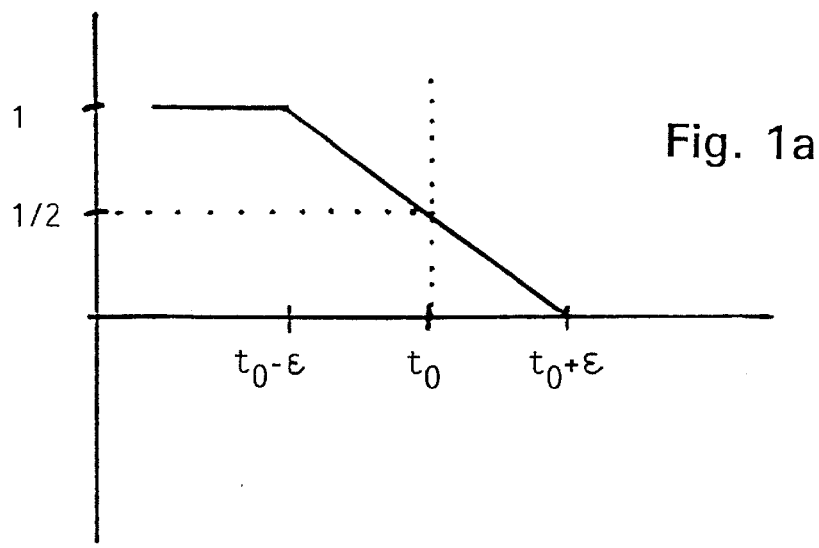
FIG. 1a shows a monotonically dropping straight line as weighting function which assumes the value ½ at the time $t_0$.
Figure 1B:
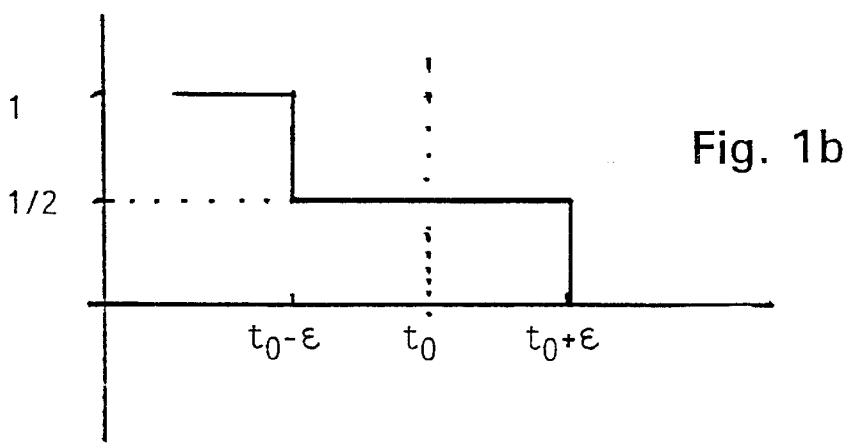
FIG. 1b shows a constant having the value ½ as weighting function.
Figure 1C:
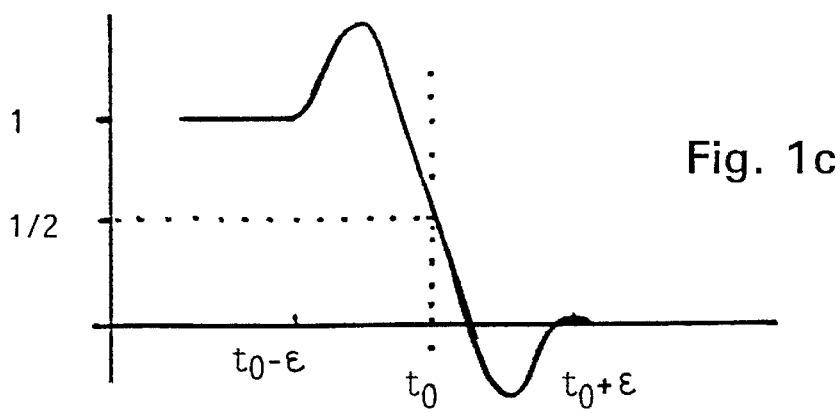

FIGS. 1a through 1c show weighting functions suitable for use in the inventive method. Weighting is carried out such that the center of the image is not double-weighted after Fourier transformation. In each case, the amplitude of the weighting function over time is shown.

The amplitude of the weighting function in FIG. 1a has the value 1 up to the time $t_0-\epsilon$. Then, the amplitude of the function assumes the shape of a monotonically dropping straight line which assumes the value 0 at the time $t_0+\epsilon$ and has the value ½ at the time $t_0$. At a later time, the value of the amplitude remains zero. The function is thus anti-symmetrical or point-symmetrical to the point having the value ½ at time $t_0$.

FIG. 1b shows a particularly simple function whose amplitude assumes the value ½ at the time $t_0$ and is anti-symmetrical to same. For the times $t<t_0-\epsilon$, the amplitude of the weighting function assumes the value 1. In the interval $t_0-\epsilon<t<t_0+\epsilon$, it assumes a constant value of ½ and for times $t>t_0+\epsilon$ the value 0.

FIG. 1c shows an example of a complicated weighting function which assumes the value ½ at the point in time $t_0$ and is anti-symmetrical to that point. At times $t<t_0-\epsilon$, the function assumes again the value 1. Then it swings to a maximum which is larger than 1 and drops again assuming the value ½ at $t_0$. The amplitude continues to drop to a minimum of a negative value and rises again to 0 at $t_0+\epsilon$. The weighting function may, however, be any other function having an amplitude of ½ at $t_0$ and being anti-symmetrical to this point.

FIGS. 2a through 2e shall clarify the generation of a data set in the k space through spin echo signals of magnetic resonance according to prior art.

According to FIG. 2a, generation of a spin echo signal is started with a 90° RF pulse 1 (excitation pulse) which is switched approximately at the same time as a slice selection gradient 2 (FIG. 2d). Then, a first dephasing part of a read gradient 3 (FIG. 2b) is switched which is again followed by a 180° RF pulse 4 (refocusing pulse) and approximately simultaneously by a slice selection gradient 5. The spin echo signal 6 is triggered by the refocusing pulse 4 and reaches its maximum 7 at the time $t_0$. The spin echo signal 6 is symmetrical about the maximum 7 in an interval $[t_0-\epsilon, t_0+\epsilon]$. After the refocusing pulse 4, a phase encoding gradient 8 (FIG. 2c) is switched which is followed by a rephasing read gradient 9 of a duration $t_2$. During the read-out time $t_a$ which is equal to the time $t_2$ in this case, the complete spin echo signal 6 is recorded by means of a quadrature detector and subsequently digitized. The time $t_0$ is thereby located in the center of the interval $t_a$. With one dimension, the phase encoding gradient can also be omitted. In that case, the spin echo signal is symmetrical.

FIGS. 3a through 3c show a prior art excitation sequence according to U.S. Pat. No. 4,851,779. It is characterized in that the dephasing portion of the read gradient 3 between excitation pulse 1 and refocusing pulse 4 is shortened. The read gradient 9 may furthermore be switched at a later time and the spin echo signal 6 is detected only from $t_0-\epsilon$. The spin echo signal 6 is thus incomplete for the times $t<t_0-\epsilon$ and has a central part in the interval $[t_0-\epsilon;t_0+\epsilon]$. This allows e.g. to reduce the echo time.

Figures 4A, 4B, 4C:
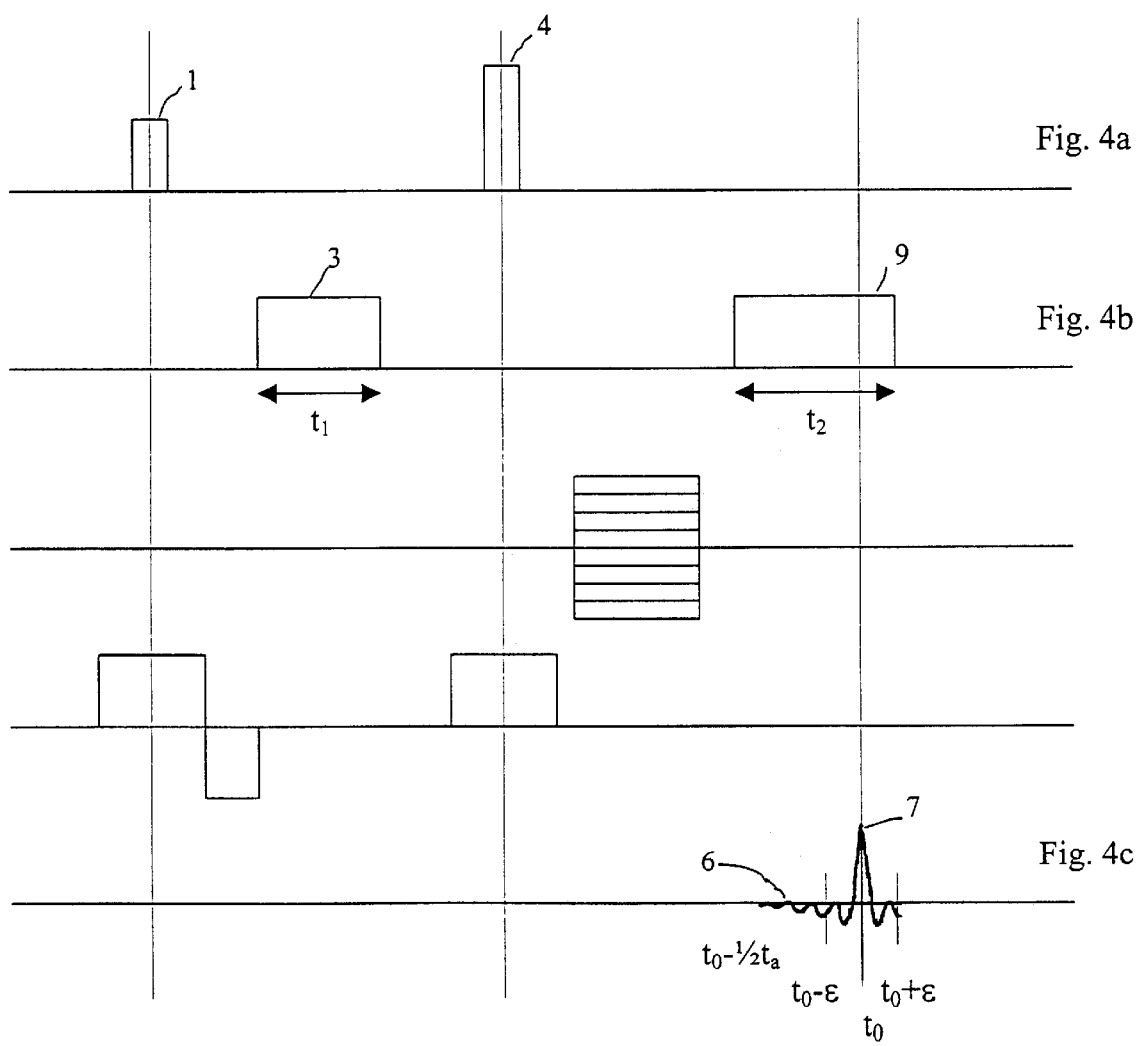
FIG. 4a shows a sequence of RF excitation pulses.
FIG. 4b shows a sequence of read gradients.
FIG. 4c shows an incomplete spin echo signal.

FIGS. 4a through 4c show a further possibility of incompletely recording the spin echo signal. This possibility is characterized in that reading out of the spin echo is finished shortly after its maximum 7. Thus, the spin echo signal 6 is incomplete for the times $t>t_0+\epsilon$ and its central part is in the interval $[t_0-\epsilon;t_0+\epsilon]$. The time saved may be used e.g. to reduce the repeating time of the experiment or to use the free time using a higher number of slices in a multi-slice experiment.

The previous explanations referred only to one dimension. This approach can also be extended to several dimensions. Omission of the read gradient produces the so-called chemical shift as further dimension.

Figure 5A:
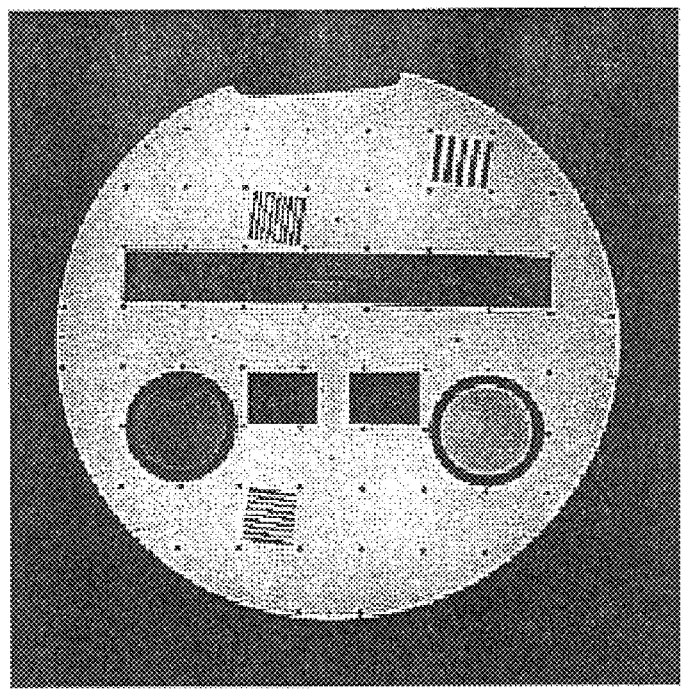
FIG. 5a shows a two-dimensional image reconstructed from a complete data set in the two-dimensional k space.

FIG. 5a shows a two-dimensional image produced from a completely scanned k space. A k space line was recorded and then a first Fourier transformation was applied. After recording and transformation of all lines, a second Fourier transformation was carried out in columns onto the already transformed data. Then, the magnitude of the complex image data was used to produce an image. This case represents the ideal case with respect to image resolution and information contained in the image.

Figure 5B:
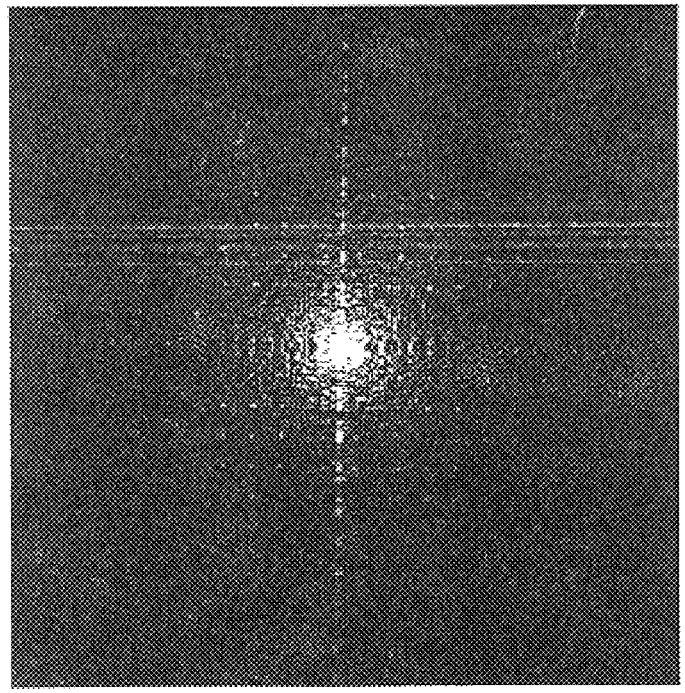

FIG. 5b shows a complete two-dimensional k space. Scanning of a line (line, column or any straight line) corresponds to the one-dimensional case according to FIGS. 2a through 2e. The imaging sequence is repeated with a phase encoding gradient (FIG. 2c) which is systematically incremented. This is repeated until the entire k space has been detected.

In spin echo imaging, the amount of the detected spin echo signals in the center of the data set is a maximum as shown in FIG. 5b. This value corresponds to the value which was detected without phase encoding along all phase encoding directions and complete rephasing under the read gradient. Side maxima are shown on an imaginary straight line which extends through the center of the k space, however, deviates from the horizontal. Side maxima are furthermore shown on an imaginary straight line through the center which slightly differs from a vertical line through the center. The side maxima on the straight line are anti-symmetrical to the center of the k space. It is clearly shown that the entire k space is symmetrical with respect to its center. The prior art methods utilize this property to reconstruct an image from an incompletely scanned k space through detecting slightly more than half of the k space and generating the missing data through forming the conjugated complexes from the detected data. The precondition of these methods is scanning of the entire k space before forming the conjugated complexes. Also in this case, it is not possible to start reconstruction of the image before scanning the entire k space.

Figure 6A:
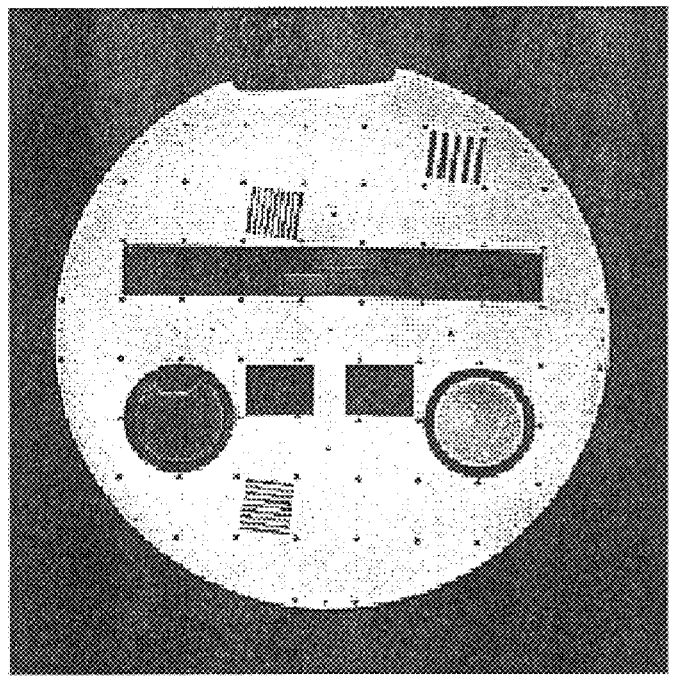
FIG. 6a shows a two-dimensional image reconstructed from an incomplete data set in the two-dimensional k space.

FIG. 6a shows a two-dimensional image which was reconstructed from an incomplete data set in the k space. A comparison with FIG. 5a shows that the information content of the image and the sharpness of the image practically do not differ from that of FIG. 5a. The entire image information was kept because there was information for any image point in the form of a complex number, i.e. each point is determined by two values, real and imaginary part. The image information is therefore over-determined. When the image is reconstructed in accordance with the two methods, the real part remains the same, whereas the imaginary part differs. The imaginary part is not required for reconstructing the entire image information. It is therefore sufficient to operate with a incomplete data set in the k space.

Figure 6B:
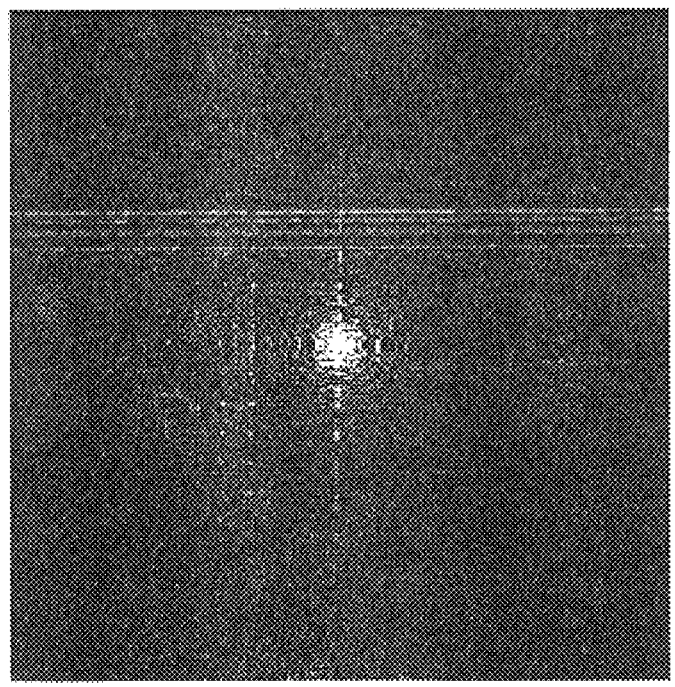

FIG. 6b shows the two-dimensional k space which forms the basis of FIG. 6a. This k space was scanned slightly more than half along a line (in the read direction) in one dimension. Slightly more than half must be recorded in the read direction to determine the echo position. The rest of the line was filled with zeros shown in FIG. 6b in black. Reconstruction of the first line can be started as soon as the first line has been read in. This has the consequence that reconstruction of the image can be started as long as following lines are still read. The data read is weighted with a function having the value ½ at point $t_0$ and being anti-symmetrical thereto. Basically, any function having the above-mentioned properties can be used. The use of straight lines or of a constant having the value ½ is particularly simple. This weighting is required to prevent double weighting of the center after Fourier transformation.

Reconstruction of the image data is followed by phase correction. The phase correction values are determined during a pre-scan. The spin echo signal is recorded without the influence of a phase encoding gradient to determine the center of the echo, wherein the central symmetry of the echo is utilized and the coefficients of the zero and first order of phase correction are determined therefrom.

The coefficient of first order is defined through the position of the maximum of the spin echo signal. Thus, in a first step, the maximum of the amount of the complex spin echo signal is determined. Due to digitalization of the signal, the maximum must not lie exactly on a measuring point. Therefore in a second step, the difference $\Delta A_1$ of the areas of the signal amount before and after the maximum of the spin echo signal, determined in the first step is formed. The number of measuring points used depends on $\epsilon$ and the digitization rate, wherein the signal-to-noise ratio of the measuring data restricts $\epsilon$. In a third step, the echo center is slightly changed by means of Fourier transformation, phase correction of first order and return transformation. In a fourth step, a surface difference $\Delta A_2$ is determined according to the second step. The exact echo center position can be determined from the difference areas and the applied phase correction through linear interpolation. After positioning of the echo center by means of phase correction of first order onto exactly one data point, the correction of zero order is read from the phase position of the echo center. The weighting function is positioned by means of the coefficients of first order of phase correction.

Figure 7A:
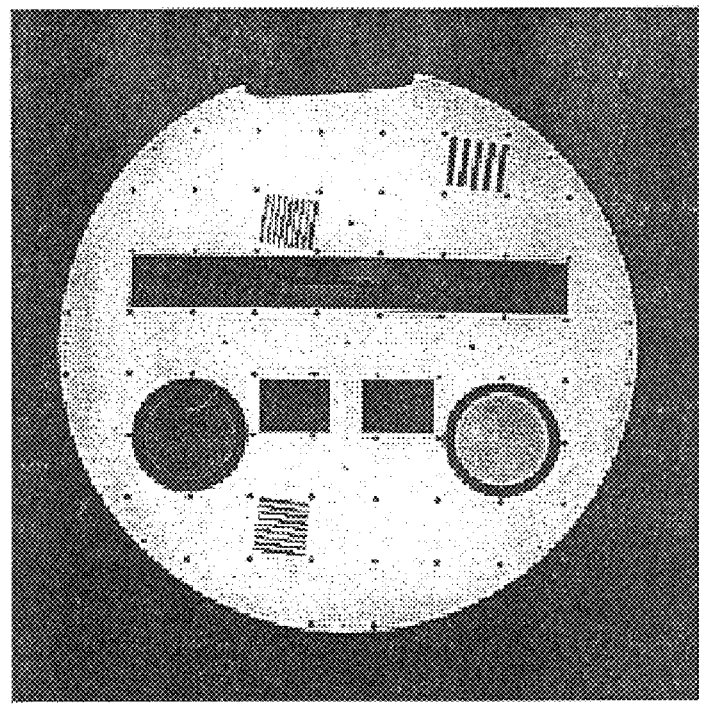
FIG. 7a shows an image reconstructed from a data set which is incomplete in another dimension, in the two-dimensional k space.
Figure 7B:
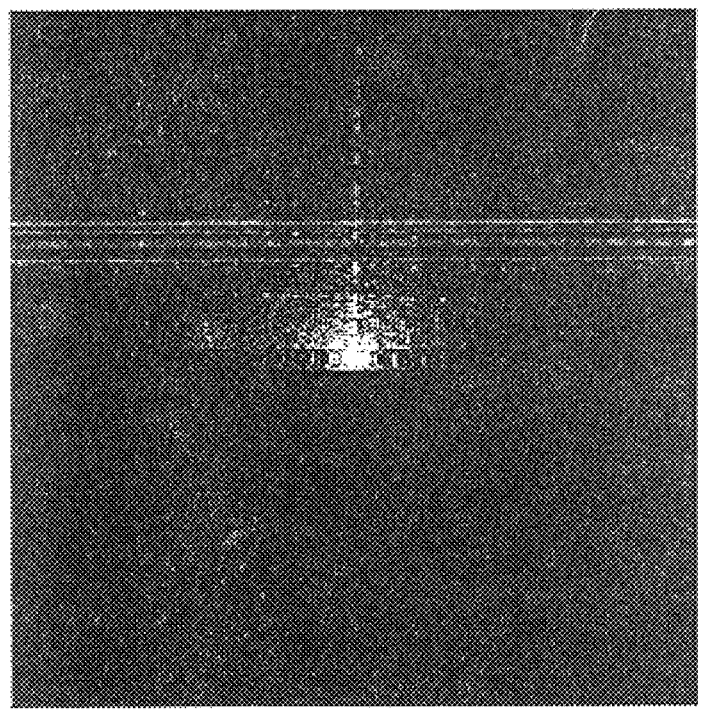

FIG. 7a shows a two-dimensional image which was reconstructed from an incomplete data set in the k space. There is again no difference to the image information and image resolution of FIGS. 5a and 6a. This image was reconstructed from an incompletely scanned k space of FIG. 7b. In this case, slightly more than half of the k space was scanned in the column direction (phase encoding direction $k_y$) while being completely scanned in the read direction $k_x$. After reading in each line in the direction $k_x$, Fourier transformation is applied. Before Fourier transformation in the direction $k_y$, the missing data was replaced by zeros (represented in black) and a weighting function was applied in the $k_y$ direction which has the value ½ about $k_y=0$.

This shows clearly that the reconstruction of an image does not depend on in which dimension the k space scanning was incomplete. A comparison of real and imaginary part of the reconstructed image with the image of the completely recorded k space shows that merely the imaginary parts differ.

This also shows that altogether, at least half of the entire k space must be detected such that the other half can be maintained through reflection to obtain an image with complete image information. The k space may be incomplete with respect to one, more than one, or all dimensions. The k space is preferably passed systematically in lines or columns such that at least half of the k space is detected and the missing k space could be maintained by conjugated complex reflection. It is, however, also feasible to pass the k space in a meandering, spiral or point-like fashion thereby detecting at least half of the k space. Passing may be effected according to certain rules or along fixed trajectories.

Figure 8A:
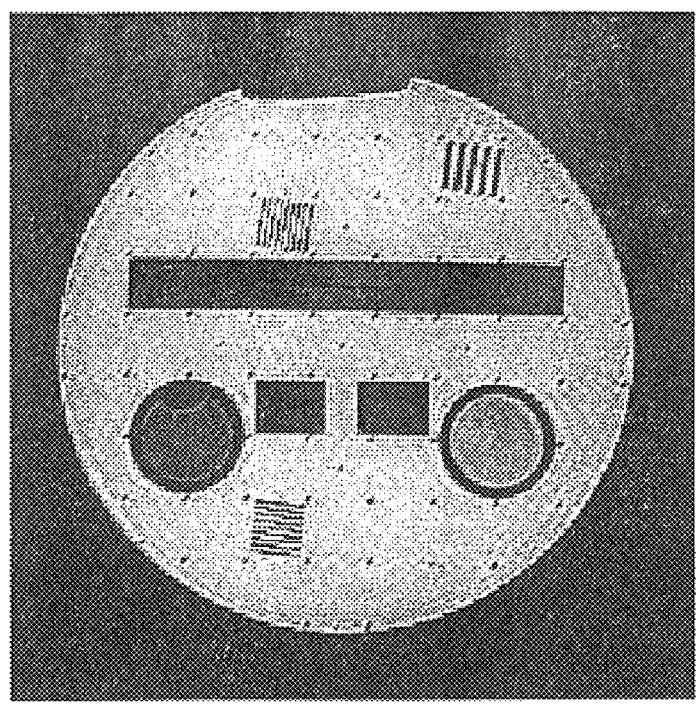
FIG. 8a shows an image reconstructed from a data set which is incomplete in two dimensions in the two-dimensional k space.
Figure 8B:
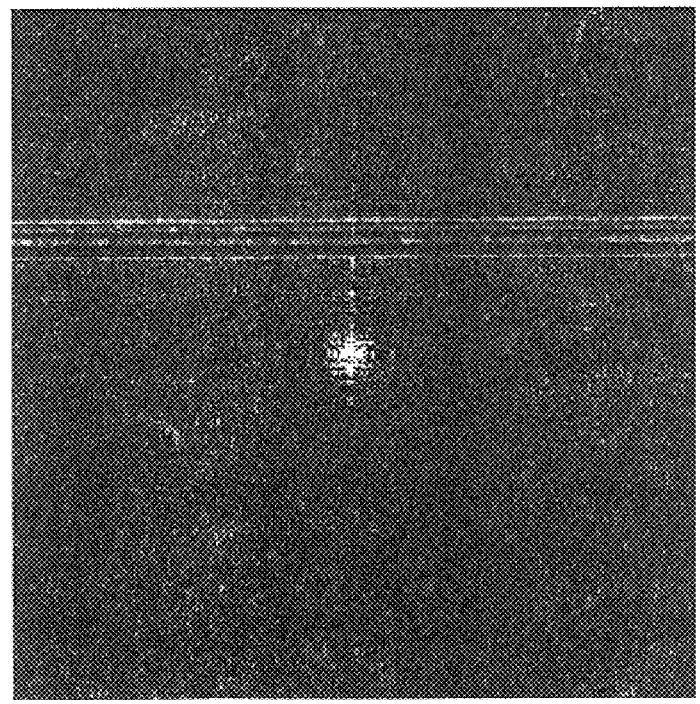

FIG. 8a shows a two-dimensional image which was reconstructed from a data set of a k space which was incompletely scanned in two dimensions. A comparison with FIGS. 5a, 6a and 7a shows a slight loss of resolution. The reconstructed object is nevertheless clearly shown. As shown in FIG. 8b, the k space was incompletely detected in the read direction $k_x$ and phase encoding direction $k_y$. Only slightly more than a quarter of the k space was scanned to reconstruct the image. The gaps and also the lines were filled with zeros. This method allows not only simultaneous processing of information but also faster detection. This is advantageous in particular when recording non-stationary objects.

The invention concerns a method of producing magnetic resonance images wherein a (n+1) dimensional k space is scanned by means of one imaging pulse sequence with at least one RF excitation pulse followed by at least one RF refocusing pulse, wherein a complex spin echo signal is read and digitized in one part of the read-out interval $[t_0-½t_a, t_0+½t_a]$ by means of a quadrature detector, with n (n=0, 1, 2, . . . ) phase encoding gradients before the read-out interval, characterized in that the digitized signal is incomplete in one or more dimensions, is completed with zeros and the central part is weighted with a function which is anti-symmetrical with respect to the k space center and is subsequently Fourier-transformed for producing a Fourier-transformed signal. This permits start of imaging while subsequent image data is still read, in contrast to prior art.

I claim:

1. Method of producing magnetic resonance images, wherein a (n+1) dimensional k space is scanned, comprising an imaging pulse sequence with at least one RF excitation pulse (1) followed by at least one RF refocusing pulse (4), wherein an incomplete complex spin echo signal $S_x$ is measured and digitized in one part of a read-out interval $[t_0-½t_a, t_0+½t_a]$ by means of a quadrature detector, which has a central part about the center ($t=t_0$) of the spin echo signal $S_x$ in the time interval $[t_0-\epsilon, t_0+\epsilon]$ with (n=0, 1, 2, . . . ) phase encoding gradients (8) before the read-out interval, wherein the digitized, incomplete, complex spin echo signal $S_x$ is completed through adding zeros for the entire read-out interval and the central part is weighted with a function which is substantially anti-symmetrical about the point $t=t_0$ and has an amplitude of ½ at the point $t_0$ and is subsequently Fourier-transformed for producing a Fourier-transformed signal, and that the Fourier-transformed signal is phase-corrected.

2. Method according to claim 1, wherein for determining the coefficients of the zero and first order of phase correction of the Fourier transformed of the spin echo signal, the spin echo signal is recorded without previous influence of a phase encoding gradient (8) and its center is determined by means of an algorithm which takes into consideration the central symmetry of this spin echo.

3. Method according to claim 2, wherein the weighting function is a linearly rising or falling function of time.

4. Method according to claim 2, wherein the weighting function is a constant having the value ½.

5. Method according to claim 1, wherein the weighting function is a linearly rising or falling function of time.

6. Method according to claim 5, wherein Fourier transformation is started before scanning of the k space is terminated.

7. Method according to claim 6, wherein a dephasing portion of a read gradient is switched before or directly after the RF refocusing pulse and a rephasing portion of the read gradient (9) is switched at least during the interval $[t_0-t_a/2, t_0+\epsilon]$ or $[t_0-\epsilon, t_0+t_a/2]$, wherein part of the complex spin echo signal $S_x$ is measured while the rephasing portion of the read gradient is effective.

8. Method according to claim 1, wherein the weighting function is a constant having the value ½.

9. Method according to claim 1, wherein Fourier transformation is started before scanning of the k space is terminated.

10. Method according to claim 1, wherein a dephasing portion of a read gradient is switched before or directly after the RF refocusing pulse and a rephasing portion of the read gradient (9) is switched at least during the interval $[t_0-t_a/2, t_0+\epsilon]$ or $[t_0-\epsilon, t_0+t_a/2]$, wherein part of the complex spin echo signal $S_x$ is measured while the rephasing portion of the read gradient is effective.

11. Method of producing magnetic resonance images wherein a (n+1) dimensional k space is scanned, comprising an imaging pulse sequence with at least one RF excitation pulse (1) in a first step, followed by at least one refocusing pulse (4) wherein at least a part of the complex spin echo signal $S_x$ is measured and digitized in at least one part of a read-out interval $[t_0-\frac{1}{2}t_a, T_0+\frac{1}{2}t_a]$ by means of a quadrature detector, which comprises a central part about the center $t=t_0$ of the spin echo signal in the time interval $[t_0-\epsilon, t+\epsilon]$, having at least one phase encoding gradient (8) before the read-out interval and wherein in subsequent steps, the phase encoding gradient (8) is systematically incremented and the k space is incompletely scanned in the direction ($k_y$) of the phase encoding gradient (8) such that for each relative point in time in the read-out interval in the phase direction ($k_y$) an incomplete signal $S_y$ results having a portion which is central about $k_y=0$, wherein the digitized, incomplete complex signal $S_y$ is completed for each relative point in time through adding zeros along $k_y$, wherein the central part is weighted with a function which is substantially anti-symmetrical about the point $k_y=0$ and has an amplitude of ½ at $k_y=0$, and is subsequently Fourier-transformed for producing a Fourier-transformed signal, and that the Fourier-transformed signal is phase-corrected.

12. Method according to claim 11, wherein for determining the coefficients of the zero and first order of phase correction of the Fourier transformed of the spin echo signal, the spin echo signal is recorded without previous influence of a phase encoding gradient (8) and its center is determined by means of an algorithm which takes into consideration the central symmetry of this spin echo.

13. Method according to claim 12, wherein the weighting function is a linearly rising or falling function of time.

14. Method according to claim 12, wherein the weighting function is a constant having the value ½.

15. Method according to claim 11, wherein the weighting function is a linearly rising or falling function of time.

16. Method according to claim 15, wherein Fourier transformation is started before scanning of the k space is terminated.

17. Method according to claim 16, wherein a dephasing portion of a read gradient is switched before or directly after the RF refocusing pulse and a rephasing portion of the read gradient (9) is switched at least during the interval $[t_0-t_a/2, t_0+\epsilon]$ or $[t_0-\epsilon, t_0+t_a/2]$, wherein part of the complex spin echo signal $S_x$ is measured while the rephasing portion of the read gradient is effective.

18. Method according to claim 11, wherein the weighting function is a constant having the value ½.

19. Method according to claim 11, wherein Fourier transformation is started before scanning of the k space is terminated.

20. Method according to claim 11, wherein a dephasing portion of a read gradient is switched before or directly after the RF refocusing pulse and a rephasing portion of the read gradient (9) is switched at least during the interval $[t_0-t_a/2, t_0+\epsilon]$ or $[t_0-\epsilon, t_0+t_a/2]$, wherein part of the complex spin echo signal $S_x$ is measured while the rephasing portion of the read gradient is effective.

* * * * *